United States Patent
Ning et al.

(10) Patent No.: US 11,623,842 B2
(45) Date of Patent: Apr. 11, 2023

(54) BUILDING HUMAN FLOW ESTIMATION SYSTEM AND ESTIMATION METHOD

(71) Applicant: HITACHI, LTD., Tokyo (JP)

(72) Inventors: Rui Ning, Tokyo (JP); Masayasu Fujiwara, Tokyo (JP); Manabu Katou, Tokyo (JP); Wataru Toriumi, Tokyo (JP); Takahiro Hatori, Tokyo (JP); Takamichi Hoshino, Tokyo (JP); Satoru Toriyabe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 469 days.

(21) Appl. No.: 16/758,420

(22) PCT Filed: Oct. 11, 2018

(86) PCT No.: PCT/JP2018/038002
§ 371 (c)(1),
(2) Date: Apr. 23, 2020

(87) PCT Pub. No.: WO2019/087729
PCT Pub. Date: May 9, 2019

(65) Prior Publication Data
US 2020/0247644 A1  Aug. 6, 2020

(30) Foreign Application Priority Data
Oct. 30, 2017  (JP) .............................. JP2017-209328

(51) Int. Cl.
*G06F 30/20*  (2020.01)
*B66B 5/00*  (2006.01)

(52) U.S. Cl.
CPC .......... *B66B 5/0037* (2013.01); *B66B 5/0012* (2013.01); *B66B 5/0018* (2013.01); *G06F 30/20* (2020.01)

(58) Field of Classification Search
CPC ...................................................... G06F 30/17
(Continued)

(56) References Cited

U.S. PATENT DOCUMENTS

| 11,407,611 B2 * | 8/2022 | Kuusinen .............. B66B 5/0037 |
| 2016/0142679 A1 | 5/2016 | Miyoshi et al. |
| 2018/0111793 A1 * | 4/2018 | Miyajima ............. B66B 5/0018 |

FOREIGN PATENT DOCUMENTS

| JP | 60-310 B2 | 1/1985 |
| JP | 62-036954 B2 | 8/1987 |

(Continued)

OTHER PUBLICATIONS

Japanese Office Action received in corresponding Japanese Application No. 2017-209328 dated Aug. 24, 2021.
(Continued)

*Primary Examiner* — Andy Ho
(74) *Attorney, Agent, or Firm* — Mattingly & Malur, PC

(57) ABSTRACT

In a building human flow estimation system having a building human flow simulation section which receives, as input values, building traffic data indicative of floors between which people move by using an elevator in a building, building layout data related to a layout of the building, and an elevator parameter value related to the elevator and estimates a flow of people, there are provided an evaluation section which calculates an evaluation value for evaluating a reproduction degree of the flow of people estimated by the building human flow simulation section based on a first evaluation index related to the flow of people estimated by the building human flow simulation section and a second evaluation index related to an actual flow of people in the building, and an output section which outputs the evaluation value calculated by the evaluation section.

14 Claims, 13 Drawing Sheets

(58) Field of Classification Search
USPC .......................................................... 703/7
See application file for complete search history.

(56) References Cited

FOREIGN PATENT DOCUMENTS

| | | |
|---|---|---|
| JP | 07-002436 A | 1/1995 |
| JP | 2003-276963 A | 10/2003 |
| JP | 2009-096612 A | 5/2009 |
| JP | 2013-107749 A | 6/2013 |
| WO | 2014/203389 A1 | 12/2014 |

OTHER PUBLICATIONS

International Search Report of PCT/JP2018/038002 dated Dec. 18, 2018.

* cited by examiner

Fig. 3

| | 1111 | 1112 | 1113 | 1114 | 1115 | 1116 | 1117 |
|---|---|---|---|---|---|---|---|
| | ID | ELEVATOR ID | TIME | DIREC-TION | POSI-TION | IN-CAR LOAD[kg] | DOOR STATE |
| | 0 | EV1 | 7:00:00 | UP | 0 | 0 | OPEN |
| | 1 | EV1 | 7:00:10 | UP | 0 | 145 | CLOSED |
| | 2 | EV1 | 7:00:30 | UP | 9 | 145 | OPEN |
| | 3 | EV1 | 7:00:35 | UP | 9 | 60 | OPEN |
| | 4 | EV1 | 7:00:45 | UP | 9 | 130 | CLOSED |
| | ... | ... | ... | ... | ... | ... | ... |

| 1121 | 1122 | 1123 | 1124 | 1125 |
|---|---|---|---|---|
| ID | TIME | FLOOR | DIREC-TION | STATE |
| 0 | 7:00:00 | 1F | UP | CALL-ING |
| 1 | 7:00:10 | 4F | DOWN | CALL-ING |
| 2 | 7:00:25 | 1F | UP | ARRI-VAL |
| ... | ... | ... | ... | ... |

Fig. 5

| FLOOR | RELATIVE FREQUENCY OF HALL STAY TIME PERIOD[%] | | | |
|---|---|---|---|---|
| | ~10[s] | ~20[s] | ~30[s] | ... |
| B1 | 1 | 10 | 15 | ... |
| 1F | 3 | 12 | 25 | ... |
| 2F | 1 | 9 | 14 | ... |
| 3F | 1 | 8 | 17 | ... |
| ... | ... | ... | ... | ... |

Fig. 7

| ELEVATOR ID (1511) | TYPE (1512) | CAPACITY (PEOPLE) (1513) | DOOR WIDTH [mm] (1514) | RATED SPEED [m/s] (1515) | RATED ACCELERATION [m/s²] (1516) | DOOR OPENING-CLOSING TIME PERIOD [s] (1517) |
|---|---|---|---|---|---|---|
| EV1 | NORMAL | 17 | 1100 | 180 | 0.8 | 3.5 |
| EV2 | NORMAL | 17 | 1100 | 180 | 0.8 | 3.5 |
| ... | ... | ... | ... | ... | ... | ... |

| FLOOR (1521) | FLOOR HEIGHT [m] (1522) | SERVICE FLOOR (1523) | | | |
|---|---|---|---|---|---|
| | | EV1 | EV2 | EV3 | EV4 |
| B1 | 5 | ○ | ○ | — | — |
| 1F | 9 | ○ | ○ | ○ | ○ |
| 2F | 4 | ○ | ○ | — | — |
| 3F | 4 | ○ | ○ | — | — |
| ... | ... | ... | ... | ... | ... |

Fig. 8

| FLOOR | AVERAGE CALLING-CONTINUATION TIME PERIOD | NUMBER OF TIMES OF CALL BUTTON PRESSING | AVERAGE NUMBER OF PASSENGERS | AVERAGE DOOR OPENING TIME PERIOD |
|---|---|---|---|---|
| B1 | 45 | 9 | 2 | 5 |
| 1F | 42 | 42 | 8 | 10 |
| 2F | 60 | 11 | 2 | 6 |
| ... | ... | ... | ... | ... |

| TIME | NUMBER OF WAITING PEOPLE | | | |
|---|---|---|---|---|
| | B1 | 1F | 2F | ... |
| 7:00:00 | 1 | 10 | 2 | ... |
| 7:00:10 | 1 | 0 | 3 | ... |
| ... | ... | ... | ... | ... |

Fig. 13

| EVALUATION ITEM | ADJUSTMENT CANDIDATE PARAMETER | | | |
|---|---|---|---|---|
| | AVERAGE OF ARRIVAL DISTRIBUTION | NUMBER OF MOVING PEOPLE | BOARDING RATE | ... |
| AVERAGE CALLING-CONTINUATION TIME PERIOD | +0.3 | +0.3 | -0.5 | ... |
| NUMBER OF TIMES OF CALL BUTTON PRESSING | +0.1 | +0.4 | -0.3 | ... |
| AVERAGE NUMBER OF PASSENGERS | +0.3 | +0.8 | +0.8 | ... |
| AVERAGE DOOR OPENING TIME PERIOD | +0.2 | +0.7 | +0.6 | ... |
| AVERAGE NUMBER OF WAITING PEOPLE | +0.5 | +0.5 | -0.3 | ... |
| MAXIMUM NUMBER OF WAITING PEOPLE | +0.7 | +0.8 | -0.4 | ... |
| ... | ... | ... | ... | ... |

BUILDING HUMAN FLOW ESTIMATION SYSTEM AND ESTIMATION METHOD

TECHNICAL FIELD

The present invention relates to a building human flow estimation system and an estimation method, and is suitably applied to, e.g., a building human flow simulation which estimates the flow of people in a building.

BACKGROUND ART

In order to properly operate an elevator or plan renewal for improving the usability of an elevator, it is important to grasp the operation situation and the usage situation of the elevator and then predict a situation when various improvement plans are carried out.

Herein, there is disclosed a method for estimating the number of people who get on and get out of an elevator on each floor from a change of a load detected in the elevator (see PTL 1).

In addition, there is disclosed an apparatus which estimates building traffic data indicative of floors between which a pedestrian in a building moves from the number of people who get on and get out of an elevator on each floor (see PTL 2).

Further, there is disclosed an apparatus which receives, as inputs, building traffic data, layout data of each floor in a building, and information on installation conditions including the installation position, stop floors, capacity, and speed of an elevator, and simulates transport of people by the elevator (see PTL 3).

For example, by recording the change of the load detected in the elevator on each floor as operation record data of the elevator, it is possible to estimate the building traffic data by using the techniques disclosed in PTL 1 and PTL 2. Further, by using the apparatus disclosed in PTL 3, it is possible to estimate the movement of the pedestrian in the building and the operation of the elevator by performing a simulation with the building traffic data, the layout data of the building, and the information on the installation conditions of the elevator installed in the building which are used as input values. With this, it becomes possible to grasp the operation situation of the elevator and perform prediction in the case where the installation conditions and the like are changed.

CITATION LIST

Patent Literature

[PTL 1] Japanese Examined Patent Publication No. S60-310
[PTL 2] Japanese Examined Patent Publication No. S62-36954
[PTL 3] Japanese Patent Application Publication No. 2009-096612

SUMMARY OF INVENTION

Technical Problem

Herein, PTL 3 describes the function of outputting an operation record of the elevator and the number of people waiting in a hall (an estimation result indicative of the flow of people) based on a simulation result, but PTL 3 does not describe a method for determining whether or not reality is reproduced by the estimation result accurately. For example, an evaluation of the operation record of the elevator can be implemented by comparing log data of the operation record recorded in a control apparatus of the elevator with the estimation result, but it is difficult to analyze the log data without a specialist familiar with the movement of the elevator. Accordingly, only with the use of the apparatus described in PTL 3, it is still difficult to determine whether or not reality is reproduced by the estimation result accurately.

The present invention has been made in view of the points described above, and the present invention proposes a building human flow estimation system and an estimation method capable of evaluating a reproduction degree of an estimated flow of people.

Solution to Problem

In order to solve such a problem, in the present invention, in a building human flow estimation system having a building human flow simulation section which receives, as input values, building traffic data indicative of floors between which people move by using an elevator in a building, building layout data related to a layout of the building, and an elevator parameter value related to the elevator and estimates a flow of people, there are provided an evaluation section which calculates an evaluation value for evaluating a reproduction degree of the flow of people estimated by the building human flow simulation section based on a first evaluation index related to the flow of people estimated by the building human flow simulation section and a second evaluation index related to an actual flow of people in the building, and an output section which outputs the evaluation value calculated by the evaluation section.

In addition, in the present invention, in an estimation method in a building human flow estimation system having a building human flow simulation section which receives, as input values, building traffic data indicative of floors between which people move by using an elevator in a building, building layout data related to a layout of the building, and an elevator parameter value related to the elevator and estimates a flow of people, there are provided a first step of causing an evaluation section to calculate an evaluation value for evaluating a reproduction degree of the flow of people estimated by the building human flow simulation section based on a first evaluation index related to the flow of people estimated by the building human flow simulation section and a second evaluation index related to an actual flow of people in the building, and a second step of causing an output section to output the evaluation value calculated in the first step.

According to the configuration described above, the evaluation value for evaluating the reproduction degree of the estimated flow of people is outputted.

Advantageous Effects of Invention

According to the present invention, it is possible to evaluate the reproduction degree of the estimation result.

BRIEF DESCRIPTION OF DRAWINGS

FIG. 3 is a view showing an example of an elevator operation log according to the first embodiment.

FIG. 5 is a view showing an example of arrival distribution data according to the first embodiment.

FIG. 7 is a view showing an example of an elevator parameter value according to the first embodiment.

FIG. 8 is a view showing an example of an evaluation index according to the first embodiment.

FIG. 13 is a view showing an example of a correlation table according to the first embodiment.

DESCRIPTION OF EMBODIMENTS

Hereinbelow, an embodiment of the present invention will be described in detail with reference to the drawings.

(1) First Embodiment

Figure 1:
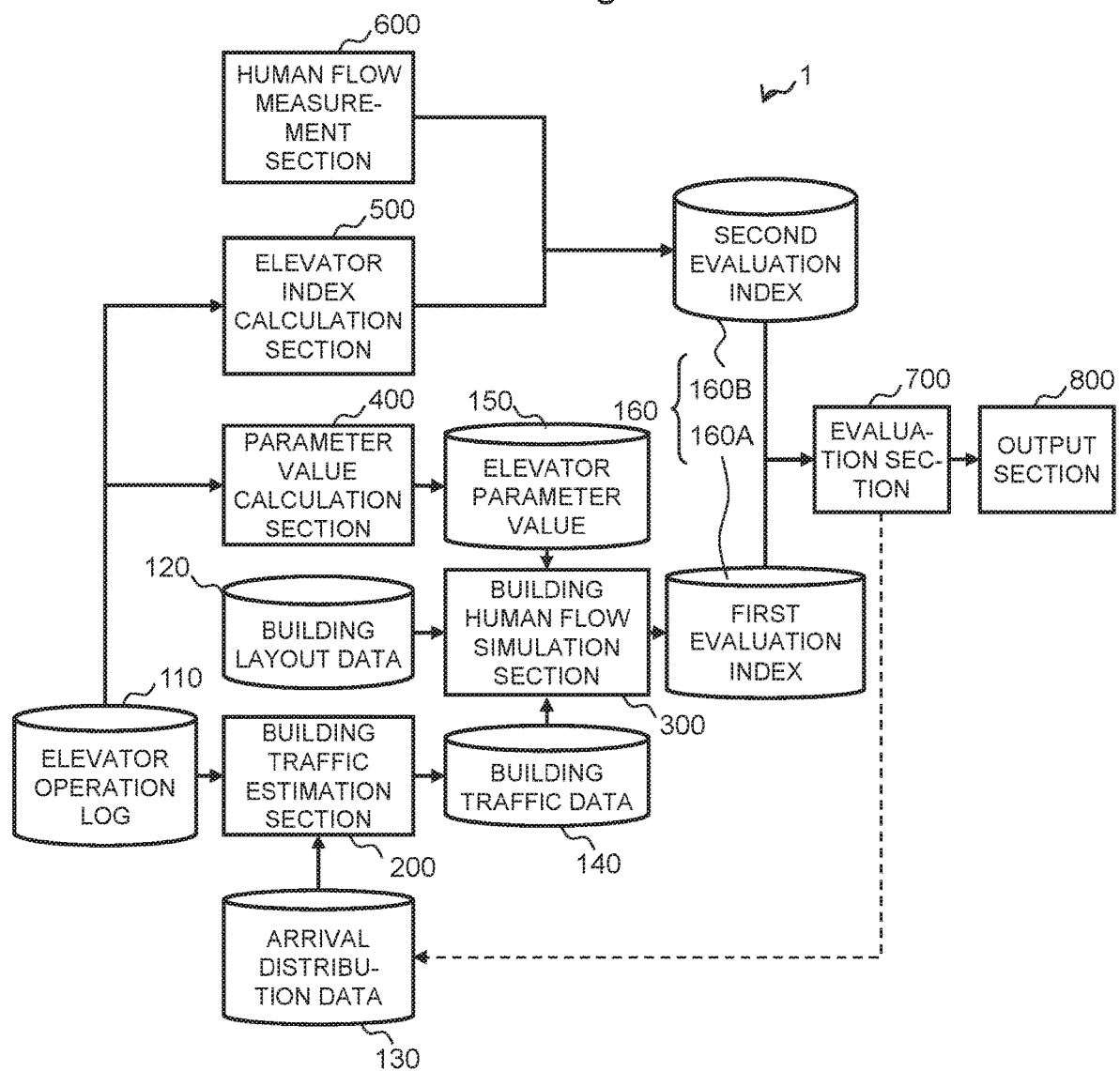
FIG. 1 is a view showing an example of the configuration of a building human flow estimation system according to a first embodiment.

In FIG. 1, 1 denotes an entire building human flow estimation system according to a first embodiment. The building human flow estimation system 1 is a system which estimates movement of people and an operation of an elevator in a building by simulation, and includes one or a plurality of computers which can communicate with each other, and software which operates on the computers.

As reproduction of the present state by the building human flow estimation system 1 becomes more elaborate, it becomes possible to obtain effects in the case where the latest elevator is introduced and effects in the case where the operation of an existing elevator is changed more accurately. However, a method for determining whether or not the present state is reproduced elaborately or a method for reproducing the present state elaborately is not disclosed. To cope with this, in the present embodiment, these methods will be mainly described.

The building human flow estimation system 1 includes various functions (a building traffic estimation section 200, a building human flow simulation section 300, a parameter value calculation section 400, an elevator index calculation section 500, a human flow measurement section 600, an evaluation section 700, and an output section 800).

One or a plurality of computers (the depiction thereof is omitted), more specifically, a CPU (Central Processing Unit) reads a program stored in a ROM (Read Only Memory) into a RAM (Random Access Memory) and executes the program (software), and the various functions of the building human flow estimation system 1 are thereby implemented. Note that part or all of the various functions of the building human flow estimation system 1 may be implemented by hardware such as a circuit and a sensor, or may also be implemented by software and hardware.

In addition, the building human flow estimation system 1 includes a storage apparatus (the depiction thereof is omitted) which can record and read, as data, an elevator operation log 110, building layout data 120, arrival distribution data 130, building traffic data 140, an elevator parameter value 150, a first evaluation index 160A, and a second evaluation index 160B. Note that each of the first evaluation index 160A and the second evaluation index 160B is appropriately referred to as an evaluation index 160 when the first and second evaluation indexes 160A and 160B do not need to be distinguished from each other.

Figure 4:
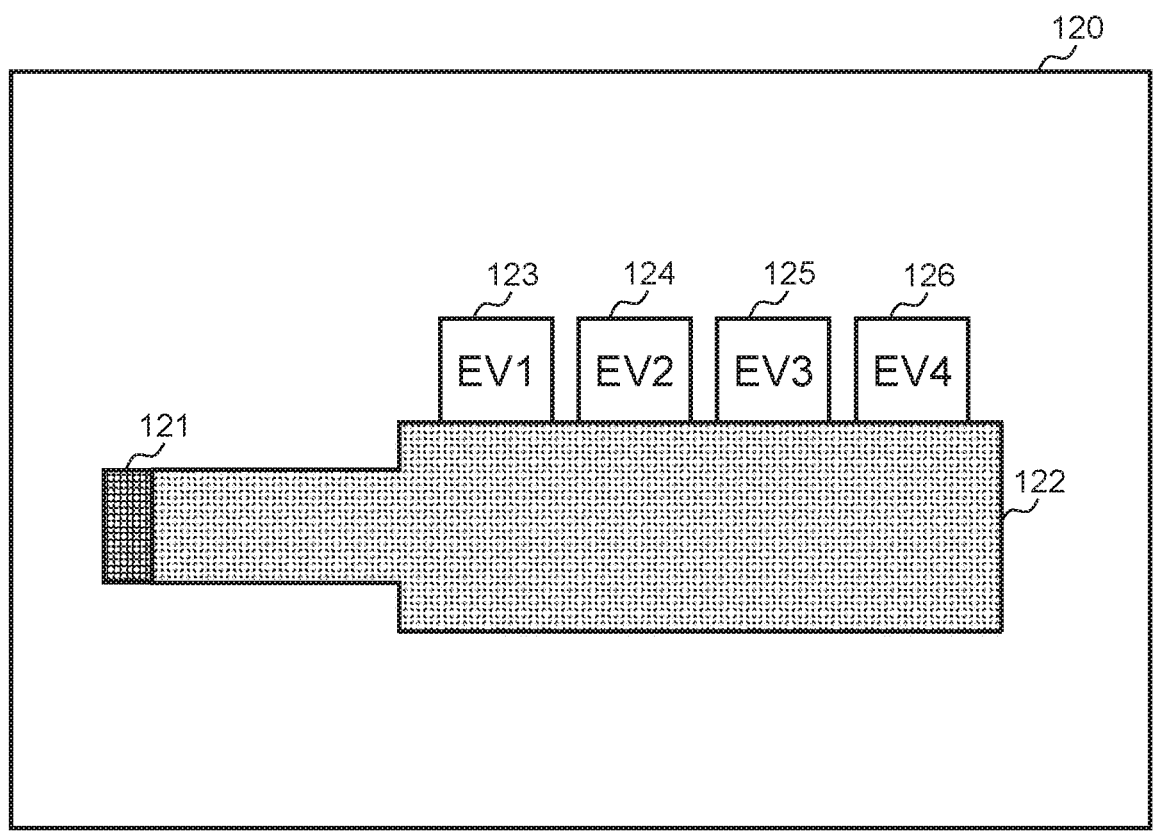
FIG. 4 is a view showing an example of building layout data according to the first embodiment.
Figure 6:
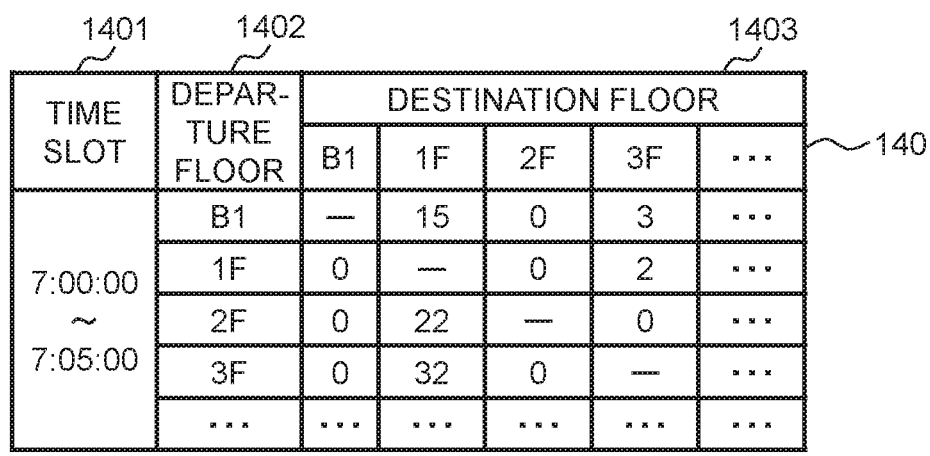
FIG. 6 is a view showing an example of building traffic data according to the first embodiment.

The elevator operation log 110 is data indicative of an operation record of the elevator and FIG. 3 shows an example of the elevator operation log 110, and the detail thereof will be described later. The building layout data 120 is data related to a layout of the building, and FIG. 4 shows an example of the building layout data 120. The arrival distribution data 130 is data indicative of how early people arrive at an elevator hall relative to a time at which people get on the elevator, and FIG. 5 shows an example of the arrival distribution data 130. The building traffic data 140 is data indicative of floors between which people move by using the elevator in the building, and FIG. 6 shows an example of the building traffic data 140. The elevator parameter value 150 is a parameter value related to the elevator, and FIG. 7 shows an example of the elevator parameter value 150. The evaluation index 160 is an index related to people and the elevator (an index related to the flow of people), and FIG. 8 shows an example of the evaluation index 160.

Description of Functions

The building traffic estimation section 200 receives the elevator operation log 110 including a change of a load of the elevator and the arrival distribution data 130 as input data, and estimates (calculates) and outputs the building traffic data 140.

A movement amount of people between floors can be estimated by combining the techniques disclosed in PTL 1 and PTL 2. In PTL 2, a time at which the movement amount on each floor occurs is a time at which a car of the elevator arrives at each floor. In the case where the movement of people present in the elevator is estimated, it is only required that the movement of people is estimated from the time at which the car arrives. However, the building human flow estimation system 1 estimates not only the movement of people in the car of the elevator but also the movement of people outside the elevator such as the movement thereof in an elevator hall.

Figure 2:
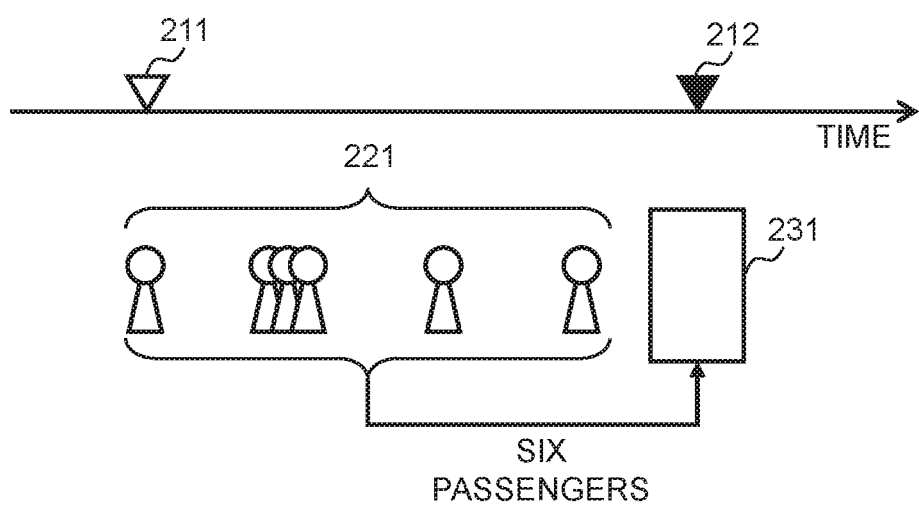
FIG. 2 is a view for explaining an arrival time at an elevator hall according to the first embodiment.

For example, as shown in FIG. 2, when consideration is given to the movement of pedestrians 221 in the elevator hall, the individual pedestrians 221 who are to get on a car 231 arrive at the elevator hall between a call button pressing time 211 and a car arrival time 212 in general, and the pedestrians 221 get on the car 231 together at the car arrival time 212. Accordingly, the pedestrians 221 arrive at the elevator hall a specific time period before the car arrival time 212. Therefore, in the building human flow estimation system 1, by using the arrival distribution data 130 in which the specific time period is defined with a distribution, on the assumption that the pedestrians 221 arrive at the elevator hall a time period corresponding to the arrival distribution data 130 before the car arrival time 212 of the elevator, the building traffic data 140 is estimated by using a time at which the pedestrians 221 arrive at the elevator hall as a start time of the pedestrians 221.

In the case where the movement of people not only in the elevator hall but also in a wide area including corridors in the building is estimated, in consideration of not only the time period corresponding to the arrival distribution data 130 but also a movement time period from a point where people in the building start the movement to the elevator hall, the building traffic data 140 is estimated by using a time the total of the time period corresponding to the arrival distribution data 130 and the movement time period before the car arrival time 212 as the start time of people. The movement time period may be set as a distribution similarly to the arrival distribution data 130, and the arrival distribution data 130 may also be created after the movement time period is added to the arrival distribution data 130. In the case where a plurality of points where people start the movement are present, the movement time period or the arrival distribution data 130 to which the movement time period is added may be created for each combination of the elevator hall and the point where people start the movement.

With such a configuration, it becomes possible to estimate not only the movement of people in the car of the elevator but also the movement of people outside the elevator such as the movement thereof in the elevator hall.

The building human flow simulation section 300 receives, as input values, the building layout data 120, the building traffic data 140, and the elevator parameter value 150, and estimates (simulates) the flow of people or outputs the first evaluation index 160A based on the result of the simulation (simulation result). More specifically, the building human flow simulation section 300 receives, as inputs, the building layout data 120 serving as structured data including the installation positions of facilities such as the elevator, the building traffic data 140 estimated by the building traffic estimation section 200, and the elevator parameter value 150 including values such as the stop floor, capacity, rated speed, and rated acceleration of the elevator, and has the function of simulating the operation of the elevator and the movement of people, and the function of compiling the simulation result and outputting the first evaluation index 160A.

In addition, the building human flow simulation section 300 has, as internal parameter values, the walking speed of people, and a boarding rate for determining whether or not to get on the car from the capacity of the car of the elevator and the number of passengers.

For example, the boarding rate is set as a threshold value indicative of the upper limit of a ratio calculated from the capacity of the car of the elevator and the number of people in the car of the elevator (a boarding ratio of the number of passengers to the capacity which is used to determine whether the car is full). By performing processing for preventing additional boarding in a simulation in the case where the boarding ratio exceeds the boarding rate, it is possible to reproduce actual action in which the additional boarding is not performed when the elevator is crowded even in the case where the elevator is not packed to capacity. As the boarding ratio, e.g., a ratio of a maximum value of an in-car load 1116 recorded in the elevator operation log 110 to the capacity is used.

Note that the boarding rate or the like has been described as the internal parameter value, but the boarding rate or the like is not limited thereto, and the boarding rate or the like may also be calculated by the parameter value calculation section 400 (may be included in the elevator parameter value 150).

Additionally, the simulation in the building human flow simulation section 300 can be implemented by using, e.g., the technique disclosed in PTL 3.

The parameter value calculation section 400 receives the elevator operation log 110 as an input, and calculates the elevator parameter value 150 (the rated speed, the rated acceleration, and the like). It is possible to determine the elevator parameter value 150 from product specifications of the elevator, but a certain error usually occurs during operation due to installation conditions and age deterioration. Accordingly, the parameter value calculation section 400 calculates the elevator parameter value 150 more accurately by using the elevator operation log 110. According to such a configuration, it becomes possible for the building human flow estimation system 1 to reproduce the present state more elaborately. Note that the parameter value calculation section 400 may be omitted and product specifications may be used as the elevator parameter value 150 without altering them.

The elevator index calculation section 500 compiles the elevator operation log 110, and calculates and outputs the second evaluation index 160B for evaluating the operation situation of the elevator. Note that the elevator index calculation section 500 may be omitted and only the index outputted by the human flow measurement section 600 may be used as the second evaluation index 160B.

The human flow measurement section 600 measures (determines by conducting a measurement) a congestion index indicative of the number of people who stay, the number of people who line up, and a congestion degree in the elevator hall. The human flow measurement section 600 includes a sensor section which conducts a measurement, and an analysis section which calculates and outputs the congestion index based on information outputted by the sensor section.

For example, the human flow measurement section 600 captures an image of the elevator hall by using a camera as the sensor section, and outputs the number of people staying in a predetermined area by using, as the analysis section, an analysis apparatus (a computer or the like) having image analysis software capable of analyzing the number of people present in the predetermined area in a camera image. The sensor section such as the camera may be installed in the elevator hall on each floor, or may also be installed in the elevator hall only on part of floors. Note that the human flow measurement section 600 may be omitted and only the index outputted by the elevator index calculation section 500 may be used as the second evaluation index 160B.

Note that the human flow measurement section 600 is not limited to the above-described configuration. For example, the human flow measurement section 600 may include the sensor section, and the building human flow estimation system 1 may include the analysis section. In addition, for example, the building human flow estimation system 1 may include the sensor section and the analysis section, and the human flow measurement section 600 may acquire the congestion index outputted from the analysis section.

The evaluation section 700 calculates an evaluation value (e.g., an error evaluation value described later) for evaluating a reproduction degree of the flow of people estimated by the building human flow simulation section 300 based on the first evaluation index 160A related to the flow of people estimated by the building human flow simulation section 300 and the second evaluation index 160B related to the actual flow of people in the building.

More specifically, the evaluation section 700 receives, as inputs, the first evaluation index 160A calculated from the movement of people and the operation of the elevator which are estimated by the building human flow simulation section 300 and the second evaluation index 160B outputted from at least one of the elevator index calculation section 500 and the human flow measurement section 600, and has the function of calculating the error evaluation value calculated from a difference between the first evaluation index 160A and the second evaluation index 160B. In addition, the evaluation section 700 has the function of calculating the arrival distribution data 130, the elevator parameter value 150, and the internal parameter value of the building human flow simulation section 300 by which the error evaluation value is made equal to or smaller than a predetermined threshold value. Further, the evaluation section 700 has the function of outputting the error evaluation value, the arrival distribution data 130, the elevator parameter value 150, and the internal parameter value of the building human flow simulation section 300 which satisfy a predetermined threshold value to the output section 800.

The output section 800 outputs the evaluation value calculated by the evaluation section 700 and the like. More specifically, the output section 800 has the function of outputting, in addition to the simulation result by the building human flow simulation section 300, the evaluation index 160 calculated based on the simulation result, the error evaluation value calculated in the evaluation section 700, and the arrival distribution data 130, the elevator parameter value 150, and the internal parameter value of the building human flow simulation section 300 which are used when the error evaluation value is calculated to a display and a printer (the depiction thereof is omitted).

Description of Data

Subsequently, data used in the building human flow estimation system 1 will be described.

FIG. 3 is a view showing an example of the elevator operation log 110. The elevator operation log 110 is data in which the state of each elevator and the state of a call button in the elevator hall are recorded. For example, the elevator operation log 110 includes an elevator state log 111 in which the state of the elevator is recorded, and a call button log 112 in which the state of the call button is recorded. The elevator operation log 110 is usually recorded by a control apparatus of the elevator, and is used as input information of the building human flow estimation system 1.

Subsequently, the elevator state log 111 will be described. The elevator state log 111 is data which is recorded, e.g., when the travel direction of the elevator is changed, when the open/closed state of a door is changed, when the state of the call button is changed, and when the load in the car when the door is opened is maximized or minimized.

Next, each item of the elevator state log 111 will be described. In an ID 1111, information (a number, a character string, or the like) which can identify each record is stored (recorded). In an elevator ID 1112, information (a number, a character string, or the like) which can identify the elevator is stored. In a time 1113, information indicative of a time at which the corresponding record is recorded is stored. In a direction 1114, information ("up", "down", or the like) which can identify the travel direction of the elevator is stored. In a position 1115, information (e.g., information indicative of a height relative to the height of the first floor of the building) which can identify the position of the elevator in a vertical direction is stored. In an in-car load 1116, information indicative of the total weight of passengers and baggage in the car is stored. In a door state 1117, information ("open", "closed", or the like) indicative of the open/closed state of the door is stored.

Subsequently, the call button log 112 will be described. The call button log 112 is data which is recorded in the case where the call button is pressed or the case where the car of the elevator has arrived. The call button log 112 is recorded separately for each elevator group controlled by the same call button group (one or a plurality of elevators controlled in association with one or a plurality of call buttons).

Note that the call button is not limited to a physical button. For example, in a control system of the elevator which is automatically allocated by the system, an allocation command of the system may be regarded as the pressing of the call button.

Next, each item of the call button log 112 will be described. In an ID 1121, information (a number, a character string, or the like) which can identify each record is stored. In a time 1122, information indicative of a time at which the corresponding record is recorded is stored. In a floor 1123, information (a number, a character string, or the like) which can identify a floor on which the call button is pressed, or a floor at which the car has arrived is stored. In a direction 1124, information ("up", "down", or the like) which can identify the direction of the pressed call button or the travel direction of the car which has arrived is stored. In a state 1125, information ("calling", "arrival", or the like) for separately recording the case where the call button has been pressed and a car allocation request has been issued, and the case where an allocated car has arrived is stored.

FIG. 4 is a view showing an example of the building layout data 120. The building layout data 120 is structured data having attribution information such as passability and passage conditions in a floor layout in the building, and is shown in the form of a plan view. For example, the building layout data 120 includes a doorway 121, a passable area 122 which shows the elevator hall and the corridor, and installation positions 123 to 126 of the elevators. Note that FIG. 4 shows one floor, but the building layout data 120 is provided such that the floor layout of the target floor to be evaluated in the building is associated with the floor.

FIG. 5 is a view showing an example of the arrival distribution data 130. The arrival distribution data 130 is data which holds a distribution indicative of how early passengers arrive at the elevator hall relative to a boarding time. In FIG. 5, the distribution is indicated by using relative frequency 1302 of a hall stay time period for each floor 1301. For example, on a floor B1, it is indicated that 1% of passengers arrive (enter) at the elevator hall 10 seconds before the boarding time of the elevator, and 10% of passengers arrive at the elevator hall 20 seconds before the boarding time of the elevator.

With regard to the distribution, the distribution may be defined by a distribution such as a normal distribution instead of the relative frequency, and the type of the distribution to be used, and parameter values such as the mean and variance may be appropriately recorded. In addition, the arrival distribution data 130 may be set for each time slot. For example, first arrival distribution data may be used from 7:00 to 7:30, and second arrival distribution data may be used from 7:30 to 8:00.

Herein, usually, people who are to get on the elevator are supposed to arrive between a call button pressing time and an elevator arrival time, and hence the distribution is set such that the frequency in a range of a difference between the call button pressing time and the elevator arrival time is increased. In addition, in the case where an immediately previous elevator which moves in the same direction is full and the call button is pressed within a predetermined time range, it may be determined that there are people who were not able to get on the immediately previous elevator, and the distribution may be set such that the frequency of the arrival time period in a range which exceeds the difference between the call button pressing time and the elevator arrival time period is increased.

FIG. 6 is a view showing an example of the building traffic data 140. The building traffic data 140 is data indicative of demand for movement between floors in the building. The building traffic data 140 is, e.g., data obtained by compiling the movement amount of people between the individual floors in the building for each time slot, and indicates the number of people who move between a departure floor 1402 and a destination floor 1403 for each time slot 1401.

In order to simulate the movement of people according to the building traffic data 140, the building human flow simulation section 300 virtually generates people with a passenger agent (an example of a program) to simulate the movement of passengers (human flow simulation). For example, in the example in FIG. 6, the building human flow simulation section 300 generates fifteen passengers moving from B1 to 1F and three passengers moving from B1 to 3F from "7:00:00" to "7:05:00" to perform the human flow simulation. Note that the generation time of people by the passenger agent may be concentrated at the start time of the time slot 1401, and the generation time may also be determined according to a specific distribution such as a uniform distribution or a Poisson distribution in the time slot.

FIG. 7 is a view showing an example of the elevator parameter value 150. The elevator parameter value 150 includes elevator specification data 151 having information on the size and the capacity of the elevator, and service floor data 152 having information on a stop floor of the elevator.

Subsequently, each item of the elevator specification data 151 will be described. In an elevator ID 1511, information (a numerical value, a character string, or the like) which can identify the elevator is stored. In a type 1512, information which can identify the type of the elevator is stored. For example, in addition to a normal-type elevator in which one car travels in one hoistway, it is possible to set a multi-car-type elevator in which a plurality of cars travel in one hoistway, and a double-deck-type elevator in which a car has two stories.

In a capacity 1513, information indicative of the capacity of the elevator is stored. The capacity 1513 is set such that passengers exceeding the capacity cannot get on the elevator. In a door width 1514, information indicative of a door width of the elevator is stored. The door width 1514 is a parameter which influences the number of people who can get on and get out of the elevator at the same time. In a rated speed 1515, information indicative of the rated speed of the elevator is stored. In a rated acceleration 1516, information indicative of the rated acceleration of the elevator is stored.

In a door opening-closing time period 1517, information indicative of a time period required to open or close the door of the elevator is stored. For example, in the door opening-closing time period 1517, a time period from when the car of the elevator arrives at the corresponding floor until when the door is completely opened, or a time period from when the door starts to close until when the car of the elevator starts to move is stored. Note that, in the case where the time period required to open the door is different from the time period required to close the door, the door opening-closing time period 1517 may be divided into a door opening time period and a door closing time period, and the door opening time period and the door closing time period may be stored.

Subsequently, each item of the service floor data 152 will be described. In a floor 1521, information (a numerical value, a character string, or the like) which can identify the floor is stored. In a floor height 1522, information indicative of a height from the corresponding floor to a floor immediately above the corresponding floor is stored. In a service floor 1523, information indicative of a floor at each elevator can stop is stored. For example, in FIG. 7, while an elevator identified by "EV1" stops at all of "B1", "1F", "2F", and "3F", an elevator identified by "EV3" stops only at "1F" out of "B1", "1F", "2F", and "3F".

FIG. 8 is a view showing an example of the evaluation index 160. The evaluation index 160 includes at least one of an elevator evaluation index 161 and a human flow evaluation index 162.

Subsequently, the elevator evaluation index 161 will be described. The elevator evaluation index 161 is an evaluation index related to the operation of the elevator calculated in the building human flow simulation section 300 and the elevator index calculation section 500. In order to evaluate both of the operation situation of the elevator and the movement of people, an index influenced by both of them is used as the elevator evaluation index 161. For example, the elevator evaluation index 161 includes items such as a floor 1611, an average calling continuation time period 1612, the number of times of call button pressing 1613, the average number of passengers 1614, and an average door opening time period 1615.

In the floor 1611, information (a number, a character string, or the like) which can identify the floor is stored. In the average calling continuation time period 1612, information indicative of an average of a time period from when the call button of the elevator is pressed until when the car of the elevator arrives is stored. In the number of times of call button pressing 1613, information indicative of a cumulative value of the number of times of pressing of the call button of the elevator is stored. In the average number of passengers 1614, information indicative of an average of the number of passengers estimated from the change of the load in the car of the elevator is stored. In the average door opening time period 1615, information indicative of an average of a time period from when the door of the elevator is opened until when the door is closed is stored.

Note that the elevator evaluation index 161 may be recorded for each of the up direction of the call button and the down direction thereof. In addition, the elevator evaluation index 161 may also be recorded separately for each elevator group controlled by the same call button group. Further, the elevator evaluation index 161 may also be calculated and recorded for the entire target time slots to be evaluated, or may also be divided for each time slot, and calculated and recorded.

Subsequently, the human flow evaluation index 162 will be described. The human flow evaluation index 162 is an evaluation index related to the human flow calculated in the building human flow simulation section 300 and the human flow measurement section 600. For example, the human flow evaluation index 162 includes items such as a time 1621 and the number of waiting people 1622.

In the time 1621, information indicative of a time at which the corresponding record is recorded is stored. In the number of waiting people 1622, information indicative of the number of waiting people in the elevator hall on each floor is stored. The human flow evaluation index 162 is recorded, e.g., when the door of the elevator is opened or closed. In addition, the human flow evaluation index 162 may also be recorded periodically, and a maximum value or an average of the number of waiting people of each period may be used as the evaluation index. When a plurality of elevator halls or elevators are present on each floor, the human flow evaluation index 162 may be recorded for each elevator hall or each elevator.

The first evaluation index 160A and the second evaluation index 160B include, as an evaluation item, at least one of the average calling continuation time period 1612, the number of times of call button pressing 1613, the average number of passengers 1614, the average door opening time period 1615, and the number of waiting people 1622 in common.

Description of Processing

Subsequently, processing of each section will be described. Note that a known technique may be used in each of the building traffic estimation section 200, the building human flow simulation section 300, the elevator index calculation section 500, the human flow measurement section 600, and the output section 800, and hence the description of the processing thereof will be omitted.

Figure 9:
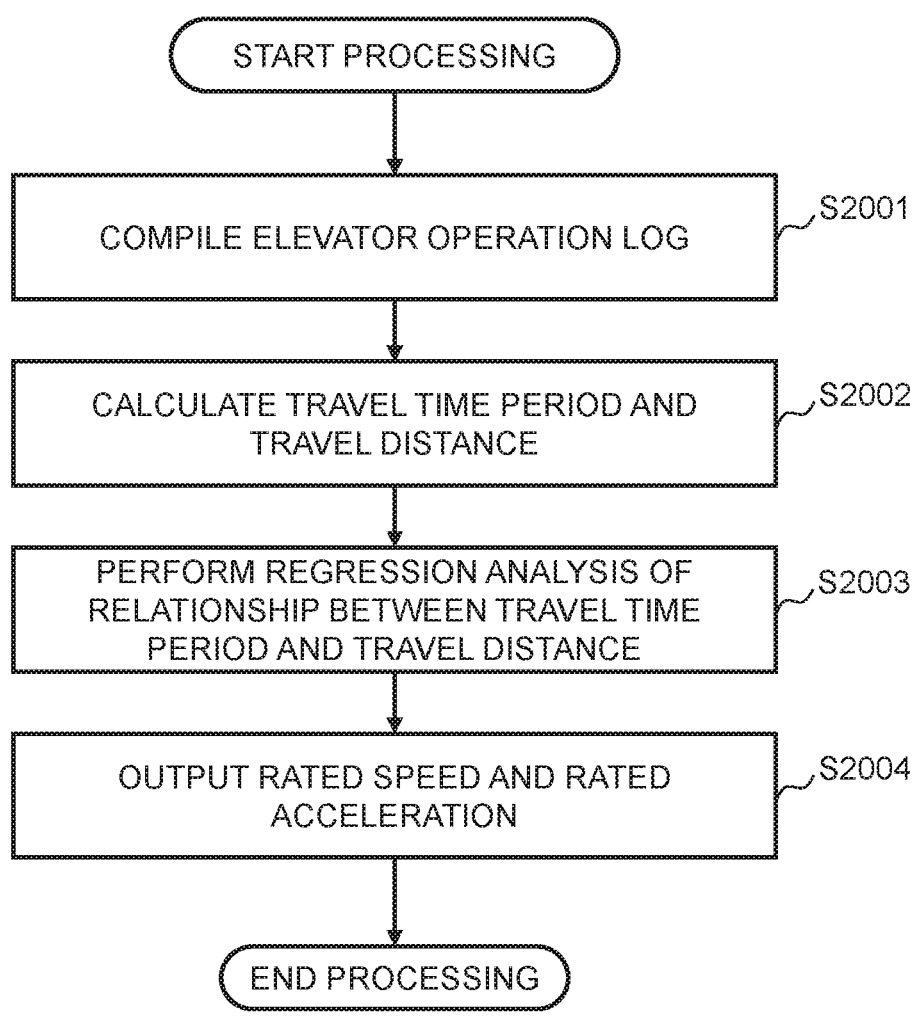
FIG. 9 is a view showing an example of a processing procedure related to processing executed by a parameter value calculation section according to the first embodiment.

First, by using FIG. 9, a description will be given of an example of a processing procedure related to processing executed by the parameter value calculation section 400.

In Step S2001, the parameter value calculation section 400 compiles (acquires) the elevator operation log 110.

Subsequently, the parameter value calculation section 400 calculates a travel time period and a travel distance of the elevator between floors from the elevator operation log 110, and creates travel record data which is information in which the travel time period and the travel distance are combined (Step S2002). For example, from the elevator state log 111, the parameter value calculation section 400 uses a record in which the door state 1117 is "closed" as data at the time of start of travel and uses a record in which the door state 1117 of the same elevator is "open" immediately thereafter as data at the time of stop of travel, calculates a difference between the time 1113 at the time of stop of travel and the time 1113 at the time of start of travel as the travel time period, calculates a difference between the position 1115 at the time of stop of travel and the position 1115 at the time of start of travel as the travel distance, and uses the combination thereof as the travel record data.

Figure 10:
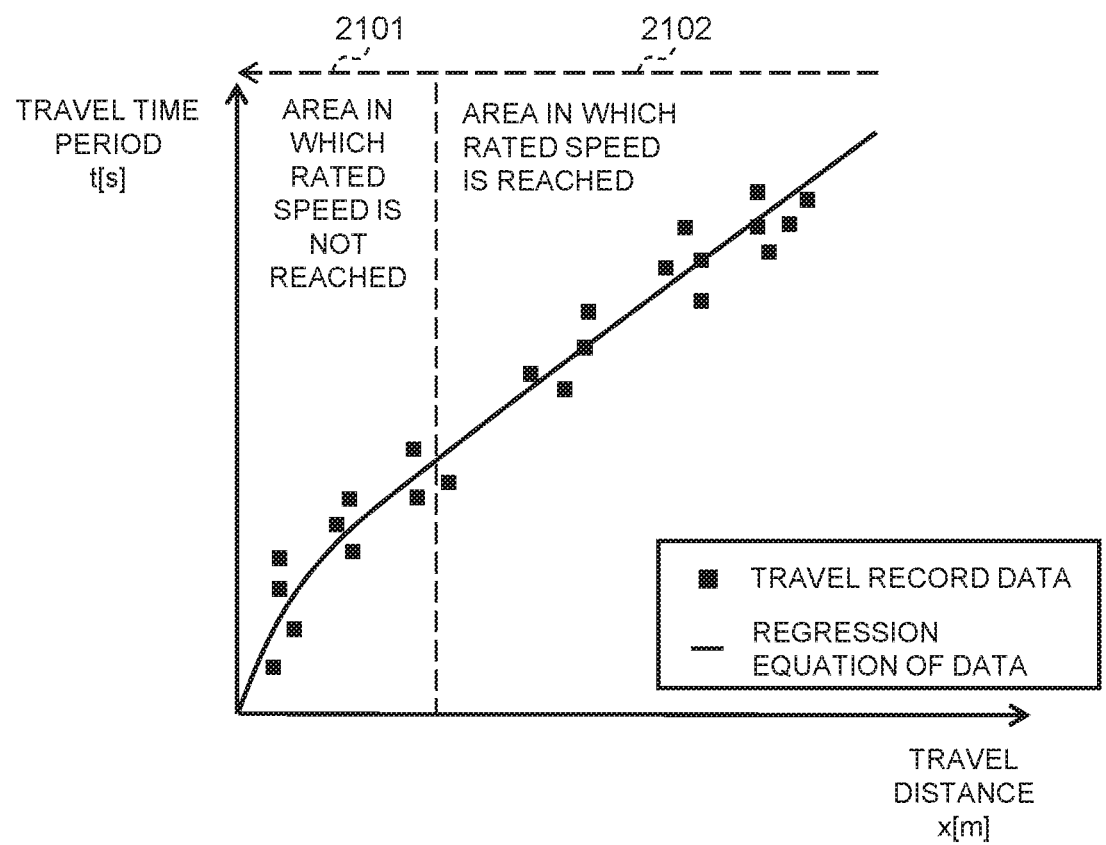
FIG. 10 is a view showing an example of a relationship between a travel distance and a travel time period according to the first embodiment.

Subsequently, the parameter value calculation section 400 determines the rated acceleration and the rated speed by a regression analysis of a relationship between the travel time period and the travel distance (Step S2003). At this point, as shown in FIG. 10, when the travel record data is shown in a scatter diagram of the travel time period and the travel distance, the scatter diagram can be separated into a non-linear area 2101 in which the rated speed is not reached and a linear area 2102 in which the rated speed is reached.

Figure 11:
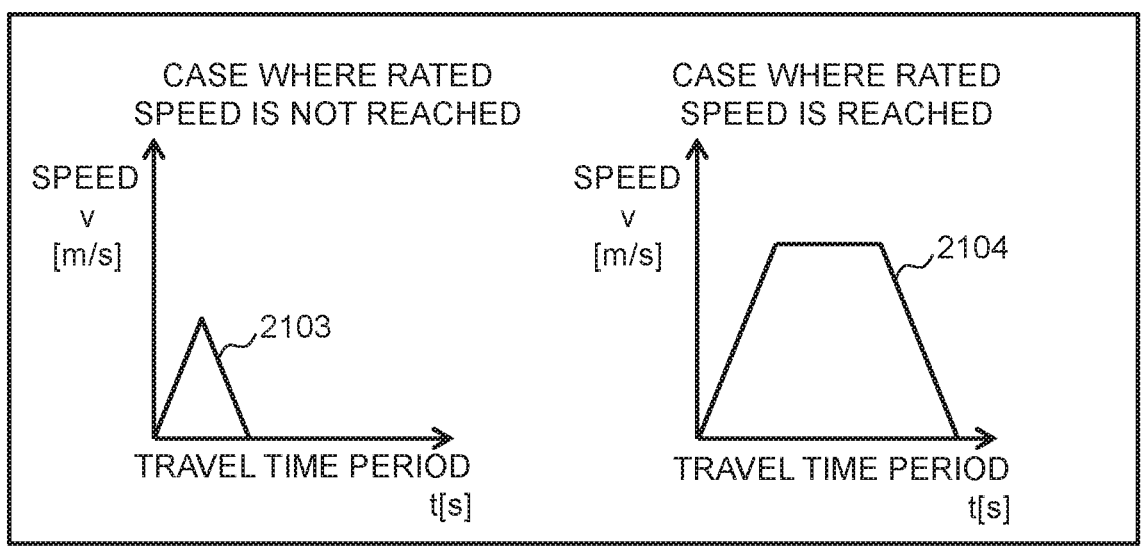
FIG. 11 is a view showing an example of a relationship between the travel time period and a speed according to the first embodiment.

In the area 2101 in which the rated speed is not reached, as shown in a graph 2103 in FIG. 11, the speed of the elevator changes. A travel distance x is a value obtained by time-integrating a speed v, and hence, when a denotes the rated acceleration, a relationship between the travel distance x and a travel time period t can be expressed as the following formula (1):

[Math. 1]

$$t = 2\sqrt{\frac{x}{a}}$$

Formula (1)

Similarly, in the area 2102 in which the rated speed is reached, the speed of the elevator changes as shown in a graph 2104 and, when a denotes the rated acceleration and V denotes the rated speed, the relationship between the travel time period t and the travel distance x can be expressed as the following formula (2):

[Math. 2]

$$t = \frac{x}{V} - \frac{V}{a}$$

Formula (2)

Let N denote the set of the travel record data included in the area in which the rated speed is not reached and let R denote the set of the travel record data included in the area in which the rated speed is reached, and the parameter value calculation section 400 determines a and V which minimize the error sum of squares represented in the following formula (3):

[Math. 3]

$$\sum_{i \in N}\left\{t_i - \left(2\sqrt{\frac{x_i}{a}}\right)\right\}^2 + \sum_{i \in R}\left\{t_i - \left(\frac{x_i}{V} + \frac{V}{a}\right)\right\}^2$$

Formula (3)

With regard to a search for minimum values, probably, neither of a nor V is significantly deviated from the specification value of the elevator, and hence the minimum values can be determined by searching for all values in specific ranges from the specification values. In addition, the minimum values may also be determined by using an optimization method such as a generic algorithm.

Subsequently, the parameter value calculation section 400 outputs a and V which minimize the error sum of squares determined in Step S2003 as the rated acceleration and the rated speed, respectively (Step S2004). The outputted rated acceleration and rated speed are used as the elevator parameter value 150.

Note that, in the case where the elevator operation log 110 is recorded also during the travel of the elevator, the rated acceleration and the rated speed may be calculated from a relationship between the travel time period and the position.

In addition, the parameter value calculation section 400 is characterized in that the parameter value calculation section 400 automatically calculates and sets the elevator parameter value 150 which can be calculated from the elevator operation log 110, and the parameter values to be calculated are not limited to the rated speed and the rated acceleration. For example, in the case where the time at which the elevator arrives at each floor and the time at which the door is completely opened immediately after the arrival are recorded in the elevator operation log 110, an average of a difference therebetween may be determined to be the door opening-closing time period 1517.

Figure 12:
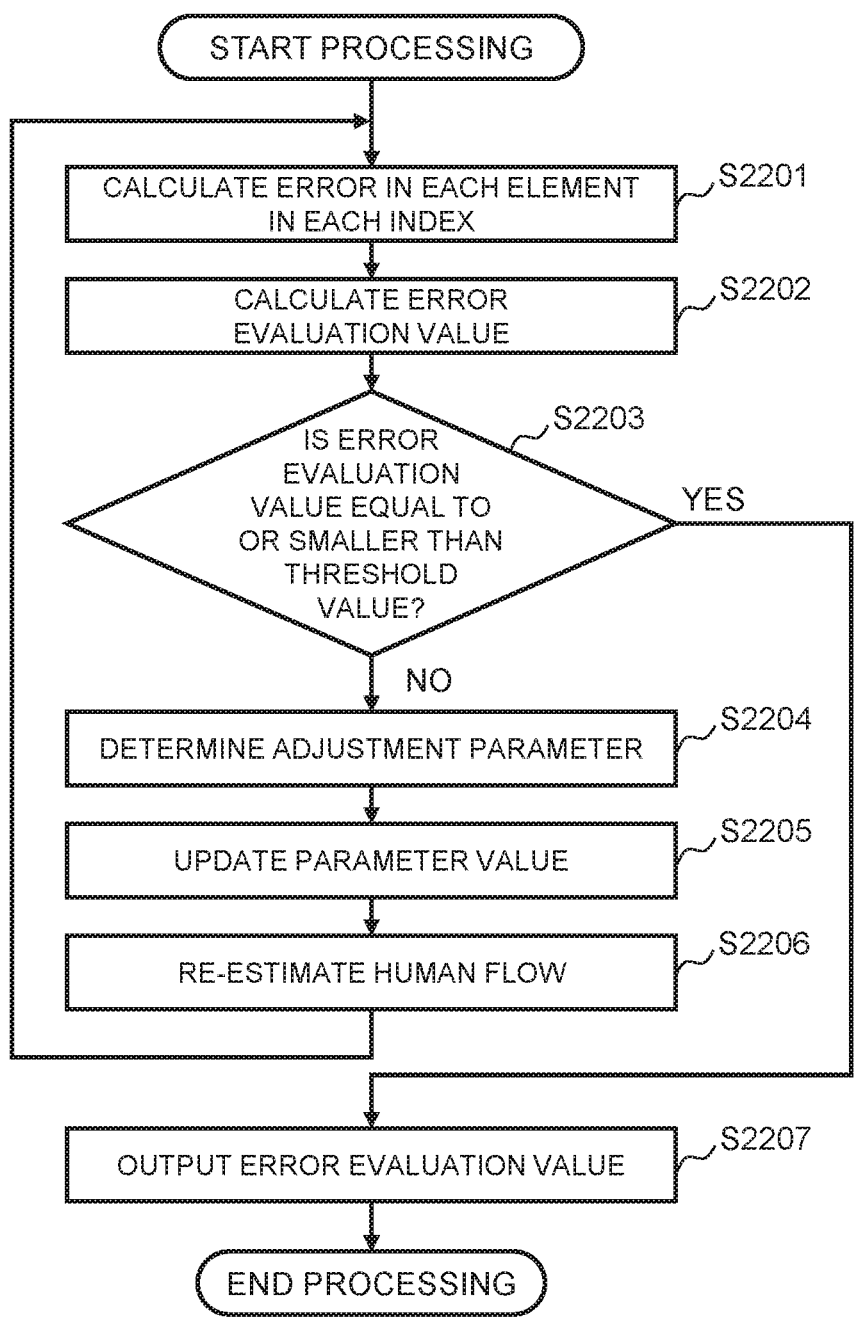
FIG. 12 is a view showing an example of a processing procedure related to processing executed by an evaluation section according to the first embodiment.

Subsequently, by using FIG. 12, a description will be given of an example of a processing procedure related to processing executed by the evaluation section 700.

In Step S2201, the evaluation section 700 receives, as inputs, the first evaluation index 160A outputted by the building human flow simulation section 300 and the second evaluation index 160B outputted by at least one of the elevator index calculation section 500 and the human flow measurement section 600, and calculates an error in each evaluation item (each element) in the first evaluation index 160A and the second evaluation index 160B.

Herein, each evaluation item denotes, e.g., the average calling continuation time period 1612, the number of times of call button pressing 1613, the average number of passengers 1614, and the average door opening time period 1615 which serve as the evaluation index of the elevator, and the number of waiting people 1622 which serves as the evaluation index of the human flow. As the error, for example, an absolute error in each evaluation item included in the first evaluation index 160A and the second evaluation index 160B is used. In the case where it is possible to segment the unit of the evaluation item such as the number of waiting people into further minor units such as the time slot and the floor, the absolute error in the element obtained by the segmentation may be directly used, or an average, a maximum value, or the total sum of the absolute errors in the elements obtained by the segmentation may also be used instead.

Subsequently, the evaluation section 700 calculates an error evaluation value obtained by compiling the errors in the individual evaluation items (Step S2202). As the error evaluation value, it is possible to use, e.g., the total sum of values obtained by multiplying the absolute values of the errors in the individual evaluation items by weights of the individual evaluation items. When I denotes the set of the evaluation items, $E_i$ denotes the error in an evaluation item i, and $W_i$ denotes a weight of the evaluation item i, an error evaluation value $E_{total}$ can be expressed as the following formula (4):

[Math. 4]

$$E_{total} = \sum_{i \in I} W_i |E_i| \qquad \text{Formula (4)}$$

Herein, the weight $W_i$ is a value which is used for the purpose of weighting in normalization or evaluation for equalizing the magnitudes of the values of the individual evaluation items. For example, it is possible to perform normalization by using the reciprocal of an average of values which each evaluation item in the second evaluation index 160B can have.

Note that it is only required that one or more types of the evaluation items in the evaluation index are used as the error evaluation value on an as-needed basis, and it is not necessary to use all of the evaluation items.

Subsequently, the evaluation section 700 determines whether or not the calculated error evaluation value is equal to or smaller than a preset threshold value (Step S2203). The evaluation section 700 shifts the processing to Step S2207 in the case where the evaluation section 700 determines that the error evaluation value is equal to or smaller than the threshold value, and the evaluation section 700 shifts the processing to Step S2204 in the case where the evaluation section 700 determines that the error evaluation value is larger than the threshold value.

In Step S2204, the evaluation section 700 determines a parameter to be adjusted (an adjustment parameter, i.e., an input parameter of which an input value is changed). For example, the evaluation section 700 determines (selects) the adjustment parameter based on the error in each evaluation item calculated in Step S2201 and a correlation table 2400 which records a correlation coefficient representing a correlation between an evaluation item 2401 shown in FIG. 13 and an adjustment candidate parameter 2402.

For example, the evaluation section 700 calculates a parameter evaluation value which is the total sum of values obtained by multiplying the correlation coefficients by the errors in the evaluation items for each adjustment candidate parameter 2402, and selects the adjustment candidate parameter 2402 which has the largest absolute value of the parameter evaluation value as the adjustment parameter. Note that, as the correlation coefficient recorded in the correlation table 2400, a value calculated from a previous simulation result may be used or a hypothetical value may also be used.

Examples of the adjustment candidate parameter 2402 include the parameter of the arrival distribution data 130 (e.g., an average of the arrival distribution), the parameter of the elevator parameter value (e.g., the number of moving people), and the parameter of the internal parameter value (e.g., the boarding rate) of the building human flow simulation section.

Subsequently, the evaluation section 700 updates a parameter value (an input value) (Step S2205). For example, the evaluation section 700 sets a value which is reduced by a predetermined value as the next parameter value in the case where the parameter evaluation value is positive, and sets a value which is increased by a predetermined value as the next parameter value in the case where the parameter evaluation value is negative.

In addition, several values may be used as candidates for the next parameter value and subjected to processing in and after Step S2206 one by one or in parallel. For example, the evaluation section 700 may use several next parameter values obtained while the predetermined value for changing the parameter value is changed as the candidates, or may use the parameter values in the case where the parameter value is increased and in the case where the parameter value is reduced as the candidates. In addition, for example, in the case where the arrival distribution data 130 is changed, the evaluation section 700 may update the mean or the variance of the arrival distribution as the parameter value.

Note that, in the case where the evaluation section 700 determines that a first elevator having a first direction as the travel direction has started without being full and a second elevator having the same direction as the first direction as the travel direction has arrived next, the evaluation section 700 may change the arrival distribution data 130 with a time range of the arrival distribution data 130 which is limited to a range from pressing of the call button for calling the second elevator to the time of the arrival of the second elevator.

Subsequently, the evaluation section 700 outputs a new condition in which the parameter value is changed to the building human flow simulation section 300 (Step S2206). The building human flow simulation section 300 calculates the first evaluation index 160A with the new condition. In addition, in the case where the evaluation section 700 changes the arrival distribution data 130 as the parameter value to be changed, the evaluation section 700 outputs the updated arrival distribution data 130 to the building traffic estimation section 200, outputs, after the building traffic data 140 is re-estimated in the building traffic estimation section 200, the re-estimated building traffic data 140 to the building human flow simulation section 300, and shifts the processing to Step S2201.

In Step S2207, the evaluation section 700 outputs the error evaluation value in addition to the human flow in the building estimated by the building human flow simulation section 300 (simulation result). In addition, besides the error evaluation value, the evaluation section 700 may output the error in each evaluation item in the evaluation index, the used parameter, or the input value.

Note that the processing of the evaluation section 700 is not limited the one described above. For example, the end condition of the change processing of the parameter value may be whether to perform the update and the evaluation of the parameter value the number of times specified in advance instead of whether or not the error evaluation value is equal to or smaller than the threshold value. In this case, the parameter value which minimizes the error evaluation value may be outputted.

In addition, for example, the method for determining the adjustment parameter is not limited to the one described above. For example, a combination of the evaluation item and the adjustment candidate parameter may be created as a table in advance, and the adjustment candidate parameter corresponding to the evaluation item which has the largest error may be used as the adjustment parameter. That is, the evaluation section 700 determines the adjustment parameter based on the error which is a difference in each evaluation item included in the first evaluation index 160A and the second evaluation index 160B.

With the processing described above, in the building human flow estimation system 1, it is possible to output the error evaluation value as the evaluation value of the reproduction degree of the operation of the elevator and the flow of people. With this, it is possible to easily compare the reproduction degrees with each other by using the error evaluation value.

In addition, PTL 3 does not describe the configuration which allows the actual number of people waiting in the hall to be acquired, and hence, even when the number of people waiting in the hall is estimated, it is not possible to determine whether reality is reproduced by the estimation result. In this regard, in the present embodiment, the human flow evaluation index 162 is measured by the human flow measurement section 600, and hence it is possible to determine whether reality is reproduced by the estimation result.

Further, in the apparatus described in PTL 3, in the case where it is determined that the estimation result is different from reality, it is difficult to find out a simulation condition capable of accurately reproducing reality. In this regard, in the present embodiment, it becomes possible to automatically calculate the simulation condition having higher evaluation with the error evaluation value used as an objective function, and output the result. With this, it becomes possible to obtain the estimation result having the higher reproduction degree.

(2) Other Embodiments

In the above-described embodiment, the case where the present invention is applied to the building human flow estimation system 1 has been described, but the present invention is not limited thereto, and the present invention can be widely applied to other various building human flow estimation systems.

In addition, in the above-described embodiment, the description has been made by using the error evaluation value as an example of the evaluation value in Step S2202, but the present invention is not limited thereto. Among the errors in the individual evaluation items, the largest error may be used as the evaluation value or an average of the errors may also be used as the evaluation value, and it is possible to use other values calculated based on the error as the evaluation values.

Further, in the above-described embodiment, the description has been given of the case where the parameter value calculation section 400 calculates the rated speed and the rated acceleration and uses them as the elevator parameter value 150, but the present invention is not limited thereto, and the parameter value calculation section 400 may use at least one of the rated speed and the rated acceleration as the elevator parameter value 150.

The individual configurations described above may be changed, combined, or omitted without changing the gist of the present invention.

REFERENCE SIGNS LIST

1 Building human flow estimation system
200 Building traffic estimation section
300 Building human flow simulation section
400 Parameter value calculation section
500 Elevator index calculation section
600 Human flow measurement section
700 Evaluation section
800 Output section

The invention claimed is:

1. A building human flow estimation system comprising:
a processor that, when executing at least one program, configures the processor to:
receive, as input values, building traffic data indicative of floors between which people move by using an elevator in a building, building layout data related to a layout of the building, and an elevator parameter value related to the elevator and estimate a flow of people;
calculate an evaluation value for evaluating a reproduction degree of the estimated flow of people based on a first evaluation index related to the estimated flow of people and a second evaluation index related to an actual flow of people in the building; and
output the calculated evaluation value,
wherein each of the first evaluation index and the second evaluation index includes, as an evaluation item, at least one of an average calling continuation time period indicative of an average of a time period from when a call button of the elevator is pressed until when a car of the elevator arrives, the number of times of call button pressing indicative of a cumulative value of the number of times of pressing of the call button of the elevator, the average number of passengers indicative of an average of the number of passengers estimated from a change of a load in the car of the elevator, an average door opening time period indicative of an average of a time period from when a door of the elevator is opened until when the door is closed, and the number of people waiting in an elevator hall.

2. The building human flow estimation system according to claim 1, wherein the processor is further configured to:
calculate the evaluation value based on an error which is a difference in each evaluation item in the first evaluation index and the second evaluation index.

3. The building human flow estimation system according to claim 1, wherein the processor is further configured to:
determine whether or not the evaluation value satisfies a predetermined threshold value and, in a case where the evaluation value does not satisfy the predetermined threshold value, change at least one of the input values of the building traffic data, the elevator parameter value, and an internal parameter value, and output the changed input value.

4. The building human flow estimation system according to claim 3, wherein the processor is further configured to:
determine an input parameter of which the input value is changed based on an error which is a difference in each evaluation item in the first evaluation index and the second evaluation index.

5. The building human flow estimation system according to claim 4, wherein
a correlation coefficient representing a correlation between each evaluation item in each of the first evaluation index and the second evaluation index and a candidate input parameter of which the input value is changed is provided, and
the processor is further configured to:
determine the input parameter of which the input value is changed based on the error which is the difference in each evaluation item in the first evaluation index and the second evaluation index and the correlation coefficient.

6. The building human flow estimation system according to claim 3, wherein the processor is further configured to:
estimate the building traffic data based on an elevator operation log indicative of an operation record of the elevator and arrival distribution data indicative of how early people arrives at an elevator hall relative to a time at which the people get on the elevator; and
change the input value serving as the building traffic data by changing the arrival distribution data and output the arrival distribution data.

7. The building human flow estimation system according to claim 6, wherein the processor is further configured to:
in a case where the processor determines that a first elevator having a first direction as a travel direction has started without being full and a second elevator having the same direction as the first direction as a travel direction has arrived next, change the arrival distribution data with a time range of the arrival distribution data which is limited to a range from pressing of a call button for calling the second elevator to a time of the arrival of the second elevator.

8. The building human flow estimation system according to claim 3, wherein the processor is further configured to:
change, as a change of the internal parameter value, a boarding rate indicative of an upper limit of a ratio calculated from a capacity of a car of the elevator and the number of people in the car of the elevator.

9. The building human flow estimation system according to claim 1, the processor is further configured to:
calculate a congestion index based on a result of measurement of people who use the elevator, and use the calculated congestion index as the second evaluation index.

10. The building human flow estimation system according to claim 9, further comprising:
a camera, and an analysis apparatus which analyzes the number of people included in a predetermined area in a camera image of the camera.

11. The building human flow estimation system according to claim 9, wherein the processor is further configured to:
use the measured number of people waiting in an elevator hall as the congestion index.

12. The building human flow estimation system according to claim 1, wherein the processor is further configured to:
calculate an evaluation index for evaluating an operation situation of the elevator based on an elevator operation log indicative of an operation record of the elevator, and uses the calculated evaluation index as the second evaluation index.

13. The building human flow estimation system according to claim 1, wherein the processor is further configured to:
calculate at least one of a rated speed and a rated acceleration of the elevator as the elevator parameter value based on data on a position of the elevator and a time corresponding to the position which is included in an elevator operation log indicative of an operation record of the elevator.

14. An estimation method in a building human flow estimation system comprising the steps of:
receiving, as input values, building traffic data indicative of floors between which people move by using an elevator in a building, building layout data related to a layout of the building, and an elevator parameter value related to the elevator and estimating a flow of people;
calculating an evaluation value for evaluating a reproduction degree of the estimated flow of people based on a first evaluation index related to the estimated flow of people and a second evaluation index related to an actual flow of people in the building; and
outputting the calculated evaluation value calculated in the first step,
wherein each of the first evaluation index and the second evaluation index includes, as an evaluation item, at least one of an average calling continuation time period indicative of an average of a time period from when a call button of the elevator is pressed until when a car of the elevator arrives, the number of times of call button pressing indicative of a cumulative value of the number of times of pressing of the call button of the elevator, the average number of passengers indicative of an average of the number of passengers estimated from a change of a load in the car of the elevator, an average door opening time period indicative of an average of a time period from when a door of the elevator is opened until when the door is closed, and the number of people waiting in an elevator hall.

* * * * *